United States Patent
Fukushi (10) Patent No.: US 7,436,689 B2
(45) Date of Patent: Oct. 14, 2008

(54) NON-VOLATILE SEMICONDUCTOR MEMORY

(75) Inventor: Isao Fukushi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 104 days.

(21) Appl. No.: 11/645,537

(22) Filed: Dec. 27, 2006

(65) Prior Publication Data

US 2008/0043512 A1 Feb. 21, 2008

(30) Foreign Application Priority Data

Aug. 18, 2006 (JP) ............................ 2006-223194

(51) Int. Cl.
*G11C 5/06* (2006.01)

(52) U.S. Cl. .................. 365/65; 365/51; 365/49.17; 365/63; 365/230.03; 365/230.09; 365/189.07; 365/49.13; 365/117; 365/145

(58) Field of Classification Search .................. 365/65, 365/51, 49.17, 63, 117, 145, 230.03, 230.09, 365/189.07, 49.13

See application file for complete search history.

(56) References Cited

U.S. PATENT DOCUMENTS

| | | | | |
|---|---|---|---|---|
| 5,339,268 A | * | 8/1994 | Machida | 365/49.17 |
| 5,418,922 A | * | 5/1995 | Liu | 711/3 |
| 5,423,011 A | * | 6/1995 | Blaner et al. | 712/240 |
| 5,652,878 A | * | 7/1997 | Craft | 707/1 |
| 5,666,494 A | * | 9/1997 | Mote, Jr. | 711/167 |
| 5,752,069 A | * | 5/1998 | Roberts et al. | 712/23 |
| 5,860,104 A | * | 1/1999 | Witt et al. | 711/137 |
| 5,889,714 A | * | 3/1999 | Schumann et al. | 365/203 |
| 5,946,705 A | * | 8/1999 | Cumming et al. | 711/108 |
| 6,253,316 B1 | * | 6/2001 | Tran et al. | 712/239 |

FOREIGN PATENT DOCUMENTS

| | | | | |
|---|---|---|---|---|
| JP | 406168119 A | * | 6/1994 | |
| JP | 407056809 A | * | 3/1995 | |
| JP | 2005-129151 A | | 5/2005 | |

* cited by examiner

*Primary Examiner*—Viet Q Nguyen
(74) *Attorney, Agent, or Firm*—Arent Fox LLP (57) ABSTRACT

When an address storing/comparing circuit stores no address identical to an external input address in read operation, in a main memory read data is written back to a data storing area after data read therefrom, and data indicating a sum of a predetermined value and a value of the read data is written to a history storing area after data read therefrom. In a sub memory, after data read from a history storing area, data read from the data storing area of the main memory is written to a data storing area and the data indicating the sum of the predetermined value and the value of the data read from the history storing area of the main memory is written to the history storing area, when the value of the data read from the history storing area of the main memory is larger than that of the sub memory.

9 Claims, 4 Drawing Sheets

NON-VOLATILE SEMICONDUCTOR MEMORY

CROSS REFERENCE TO RELATED APPLICATION

This application is based upon and claims the benefit of priority from Japanese patent application No. 2006-223194, filed on Aug. 18, 2006, the entire contents of which are incorporated herein by reference.

BACKGROUND OF THE INVENTION

1. Field of the Invention

The present invention relates to a non-volatile semiconductor memory such as a ferroelectric memory (FRAM, FeRAM).

2. Description of the Related Art

An FRAM (ferroelectric random access memory) which uses ferroelectric capacitances for memory cells can retain data when power supply is cut off. Thus, the FRAM is applied to IC cards, a storage medium of game machines and other devices. A technique associated with the FRAM is disclosed in Japanese Unexamined Patent Application Publication No. 2005-129151, for example.

Figure 1:
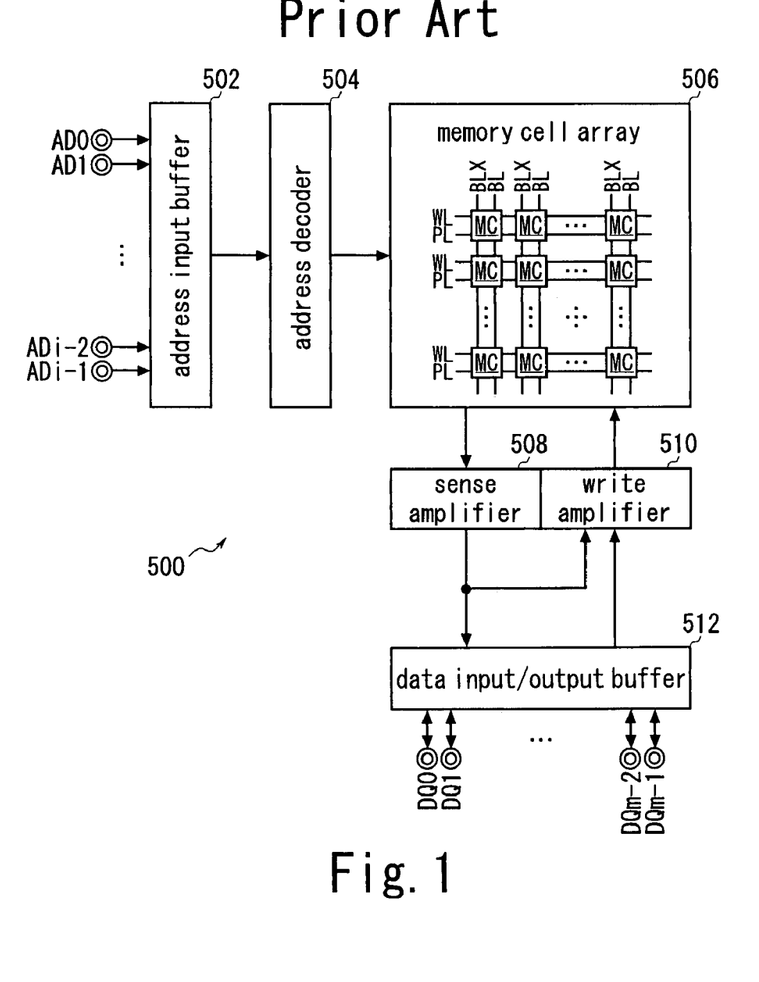
FIG. 1 is a block diagram showing an FRAM of prior art.
Figure 2:
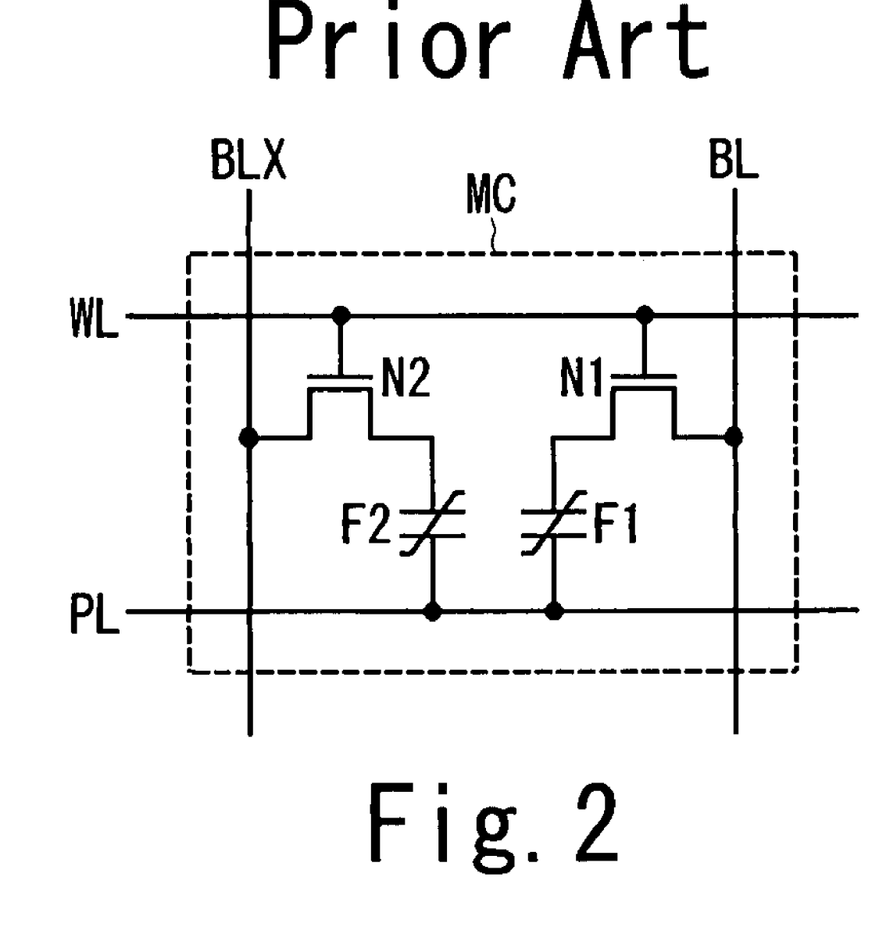
FIG. 2 is a circuit diagram of a memory cell of the FRAM shown in FIG. 1.

FIG. 1 illustrates an FRAM of prior art. FIG. 2 shows a memory cell of the FRAM in FIG. 1. As illustrated in FIG. 1, an FRAM 500 includes an address input buffer 502, an address decoder 504, a memory cell array 506, a sense amplifier 508, a write amplifier 510, and a data input/output buffer 512.

The address input buffer 502 receives an external input address inputted to address input pins AD0 through ADi-1 (i: natural number) and outputs the external input address to the address decoder 504 in read and write operations. The address decoder 504 selects one of plural rows in the memory cell array 506 based on the external input address (address supplied from the address input buffer 502) in the read and write operations.

The memory cell array 506 has a plurality of memory cells MC arranged in matrix at the cross points of plural word lines WL and plural plate lines PL and m pairs of bit lines BL and BLX (m: natural number). The memory cells MC are complementary memory cells called 2T2C type as illustrated in FIG. 2, for example, and have transfer transistors (nMOS transistors) N1 and N2 and ferroelectric capacitances F1 and F2. The transfer transistor N1 and the ferroelectric capacitance F1 are connected in series between the bit line BL and the plate line PL. The transfer transistor N2 and the ferroelectric capacitance F2 are connected in series between the bit line BLX and the plate line PL. The gates of the transfer transistors N1 and N2 are connected with the word line WL.

As illustrated in FIG. 1, the sense amplifier 508 reads data from a selected row (row selected by the address decoder 504) in the memory cell array 506 in the read operation. The write amplifier 510 writes back the data read by the sense amplifier 508 to the selected row in the memory cell array 506 in the read operation. The write amplifier 510 writes external input data (data supplied from the data input/output buffer 512) to the selected row in the memory cell array 506 in the write operation. The data input/output buffer 512 receives data read by the sense amplifier 508 and outputs the data to data input/output pins DQ0 through DQm-1 as external output data in the read operation. The data input/output buffer 512 receives external input data inputted to the data input/output pins DQ0 through DQm-1 and outputs the external input data to the write amplifier 510 in the write operation.

In the FRAM 500 having this structure, when an external input address is inputted to the address input pins AD0 through ADi-1 in the read operation, the external input address is supplied to the address decoder 504 via the address input buffer 502. Then, the row corresponding to the external input address is selected from the plural rows in the memory cell array 506. Subsequently, data is read from the selected row of the memory cell array 506 by the sense amplifier 508, and the data thus read out is outputted to the data input/output pins DQ0 through DQm-1 via the data input/output buffer 512 as external output data. The data read by the sense amplifier 508 is written back to the selected row in the memory cell array 506 by the write amplifier 510.

When an external input address is inputted to the address input pins AD0 through ADi-1 in the write operation similarly to the read operation, the external input address is supplied to the address decoder 504 via the address input buffer 502. Then, the row corresponding to the external input address is selected from the plural rows in the memory cell array 506. Subsequently, external input data inputted to the data input/output pins DQ0 through DQm-1 and supplied via the data input/output buffer 512 is written to the selected row in the memory cell array 506 by the write amplifier 510.

In the FRAM, the write operation polarizes ferroelectric capacitances constituting the memory cell as an access target by applying positive voltage or negative voltage thereto, while the read operation detects the presence or absence of reverse polarization charge by applying positive voltage to the ferroelectric capacitances constituting the memory cell as the access target. In the write operation, though not shown in detail in FIGS. 1 and 2, the word line WL is activated to a high level and the transfer transistor N1 is turned on in the memory cell MC as the access target (m memory cells MC in the row selected by the address decoder 504), and positive voltage or negative voltage is applied between the bit line BL and the plate line PL, so as to apply positive voltage or negative voltage to the ferroelectric capacitance F1 and write desired data. More specifically, when "0" data is written to the ferroelectric capacitance F1, the bit line BL is set to the ground voltage GND (0V) and the plate line PL is set to the power supply voltage VDD. When "1" data is written to the ferroelectric capacitance F1, the bit line BL is set to the power supply voltage VDD and the plate line PL is set to the ground voltage GND. Data having reverse logic of that of the data written to the ferroelectric capacitance F1 is written to the ferroelectric capacitance F2 by the similar method. When voltage applied to the ferroelectric capacitances F1 and F2 is removed after completion of the write operation, the polarization of the ferroelectric capacitances F1 and F2 is maintained. Thus, the data written to the ferroelectric capacitances F1 and F2 is retained as non-volatile data.

In the read operation, the word line WL is activated to a high level and the transfer transistor N1 is turned on in the memory cell MC as the access target, and the plate line PL is set to the power supply voltage VDD. The bit line BL is pre-charged to the ground voltage GND. When the plate line PL is set to the power source voltage VDD, positive voltage is applied to the ferroelectric capacitance F1. When the ferroelectric capacitance F1 has "0" data having been written thereto in this step, relatively small charge flows through the bit line BL without causing reverse polarization since the polarity of the voltage applied to the ferroelectric capacitance F1 in the read operation is the same as the polarity of the voltage applied thereto in the write operation. When the ferroelectric capacitance F1 has "1" data having been written thereto, relatively large charge flows through the bit line BL causing reverse polarization since the polarity of the voltage applied to the ferroelectric capacitance F1 in the read operation is the opposite polarity to that of the voltage applied thereto in the write operation. Then, read data of the ferroelectric capacitance F1 is generated by detecting the charge flowing through the bit line BL by the sense amplifier 508. In the ferroelectric capacitance F2, read data having the complementary logic of that of the read data of the ferroelectric capacitance F1 is generated by the similar method.

In the FRAM, positive voltage is applied to the ferroelectric capacitance constituting the memory cell as the access target in the read operation. Thus, data read from the ferroelectric capacitance is equivalent to "0" data write thereto, and is so-called "destructive read". As a result, "0" data is written to the ferroelectric capacitance to which '1' data has been written in the memory cell as the access target in the read operation, and it is therefore necessary to write back the "1" data to the ferroelectric capacitance.

Generally, the possible number of data rewrites to the ferroelectric capacitance is limited due to the limitations of the ferroelectric material, and is approximately 1 E10 at the largest. In the FRAM, it is necessary to write back "1" data to the ferroelectric capacitance constituting the memory cell as the access target in the read operation when the ferroelectric capacitance has "1" data having been written thereto. Thus, data write to the ferroelectric capacitance is required not only in the write operation but also in the read operation. As a result, the FRAM has greater limitations for use than semiconductor memories such as SRAM (static RAM) and DRAM (dynamic RAM), which can perform access operation (read operation and write operation) without limitation. It is therefore demanded to develop a technique enabling reduction in the number of repetitive data writes required in the read operation in the non-volatile semiconductor memory (such as FRAM) so that a life of the non-volatile semiconductor memory can be prolonged.

SUMMARY OF THE INVENTION

It is an object of the invention to provide a non-volatile semiconductor memory which reduces the number of repetitive data writes in read operation so that the life of the non-volatile semiconductor memory can be prolonged.

A non-volatile semiconductor memory according to an aspect of the invention includes a non-volatile main memory, an address storing/comparing circuit, and a volatile sub memory. The main memory has a plurality of rows each composed of a corresponding part of a data storing area for storing actual data and a corresponding part of a history storing area for storing access number data. The address storing/comparing circuit has a plurality of rows for storing an address. The sub memory includes a plurality of rows in correspondence with the plural rows in the address storing/comparing circuit. Each of the plural rows is composed of a corresponding part of a data storing area for storing actual data and a corresponding part of a history storing area for storing access number data.

When the address storing/comparing circuit stores an address identical to an external input address in read operation, in a row of the sub memory corresponding to a row storing an address identical to the external input address in the address storing/comparing circuit, data is read as external output data from a corresponding part of a data storing area.

When the address storing/comparing circuit stores no address identical to the external input address in read operation, in a row of the main memory corresponding to the external input address, after data is read as external output data from a corresponding part of a data storing area, the read data is written back thereto, and after data is read from a corresponding part of a history storing area, data indicating a sum of a predetermined value and a value of the read data is written thereto. In a row of the sub memory corresponding to a row randomly selected from the plural rows in the address storing/comparing circuit, after data is read from a corresponding part of a history storing area, when a value of the data read from the history storing area of the main memory is larger than a value of the data read from the history storing area of the sub memory, the data read from the data storing area of the main memory is written to a corresponding part of a data storing area, and the data indicating the sum of the predetermined value and the value of the data read from the history storing area of the main memory is written to the corresponding part of the history storing area. Also, the external input address is written to the selected row of the address storing/comparing circuit when the value of the data read from the history storing area of the main memory is larger than the value of the data read from that of the sub memory.

It is preferable that in write operation, in a row of the main memory corresponding to the external input address, external input data is written to a corresponding part of a data storing area, and after data is read from a corresponding part of a history storing area, the data indicating the sum of the predetermined value and the value of the read data is written thereto. When the address storing/comparing circuit stores an address identical to the external input address in write operation, in a row of the sub memory corresponding to a row storing the address identical to the external input address in the address storing/comparing circuit, the external input data is written to a corresponding part of a data storing area, and the data indicating the sum of the predetermined value and the value of the data read from the history storing area of the main memory is written to a corresponding part of a history storing area. When the address storing/comparing circuit stores no address identical to the external input address in write operation, no data is written to the sub memory.

In the non-volatile semiconductor memory as described above, when in read operation the address storing/comparing circuit stores no address identical to the external input address and a value of access number data read from the main memory is larger than a value of access number data read from the sub memory, actual data read from the main memory and the access number data indicating the sum of the predetermined value and the value of the access number data read from the main memory are written to the sub memory. Thus, in a subsequent read operation where the same external input address is used, the actual data is read from the sub memory instead of the main memory without necessity for writing back the data to the main memory. When the address storing/comparing circuit stores no address identical to the external input address in read operation, a row to be a target of data write is randomly selected in the sub memory. Therefore, the actual data at addresses with large access numbers are read from the sub memory while access operation (read operation and write operation) is repetitively performed, so that data at the addresses with a higher access frequency are read more likely from the sub memory instead of the main memory. This results in substantially reducing the number of times data is written back to the main memory in read operation, making it possible to prolong the life of the non-volatile semiconductor memory.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments according to the invention are hereinafter described with reference to the accompanying drawings.

Figure 3:
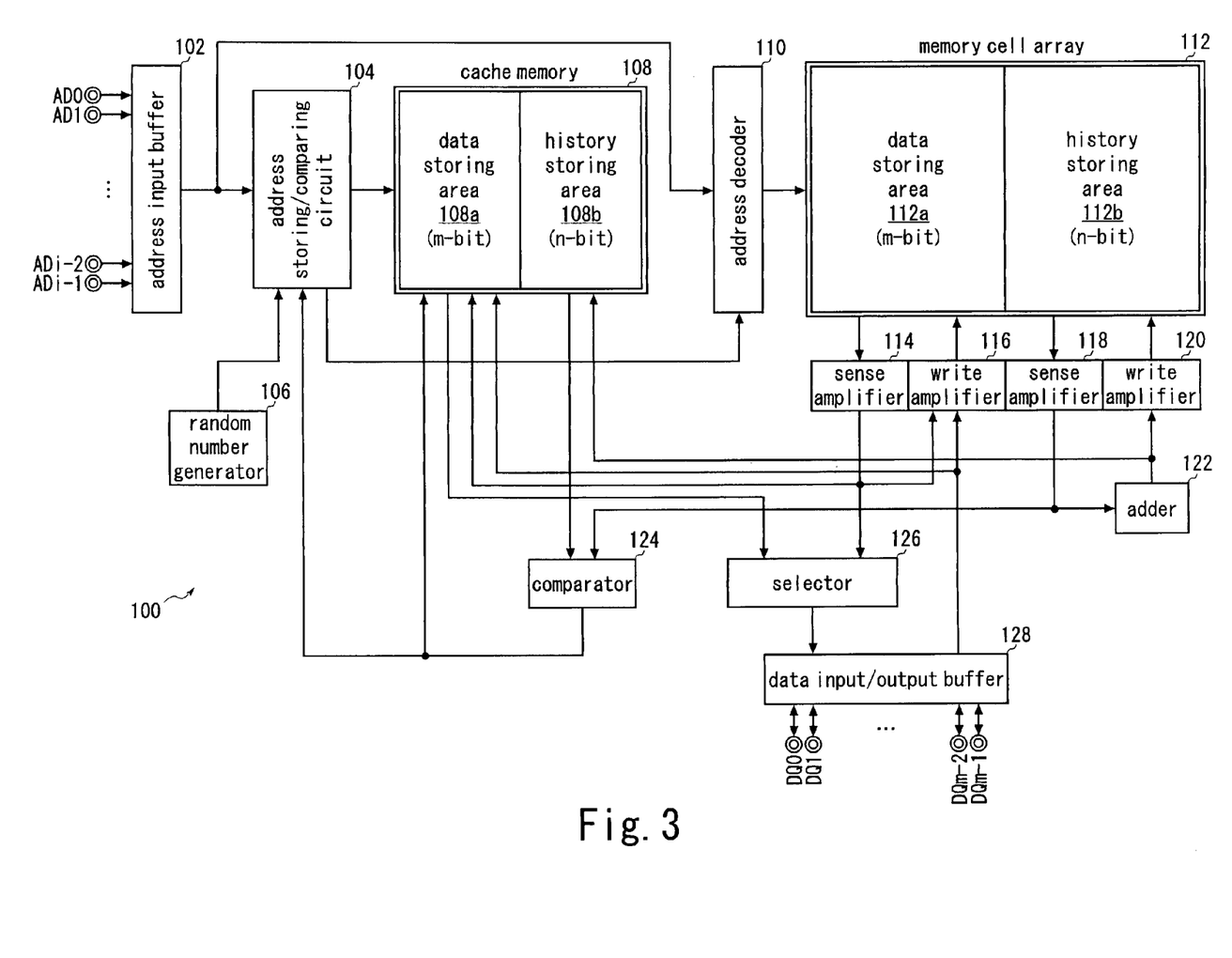
FIG. 3 is a block diagram of a non-volatile semiconductor memory in a first embodiment according to the invention.

FIG. 3 illustrates a non-volatile semiconductor memory in a first embodiment according to the invention. A non-volatile semiconductor memory 100 in the first embodiment is an FRAM, and includes an address input buffer 102, an address storing/comparing circuit 104, a random number generator 106, a cache memory 108, an address decoder 110, a memory cell array 112, a sense amplifier 114, a write amplifier 116, a sense amplifier 118, a write amplifier 120, an adder 122, a comparator 124, a selector 126, and a data input/output buffer 128.

The address input buffer 102 receives an external input address inputted to the address input pins AD0 through ADi-1 (i: natural number) and outputs the external input address to the address storing/comparing circuit 104 and the address decoder 110 in the read and write operations.

The address storing/comparing circuit 104 has k rows (k: natural number) each of which stores an address having i bits, and functions as an associative memory (CAM: content addressable memory). In the read and write operations, the address storing/comparing circuit 104 compares the external input address (address supplied from the address input buffer 102) with each of the k addresses stored in the address storing/comparing circuit 104.

When the address storing/comparing circuit 104 stores an address identical to the external input address in the read operation, the address storing/comparing circuit 104 activates a control signal for prohibiting the operation of the address decoder 110 and selects one of k rows in the cache memory 108 in correspondence with the row containing the address identical to the external input address in the address storing/comparing circuit 104.

When the address storing/comparing circuit 104 stores no address identical to the external input address in the read operation, the address storing/comparing circuit 104 selects one of the k rows in the address storing/comparing circuit 104 based on the random data supplied from the random number generator 106 and selects one of the k rows in the cache memory 108 in correspondence with the row selected according to the random data in the address storing/comparing circuit 104. When the address storing/comparing circuit 104 stores no address identical to the external input address in the read operation, the address storing/comparing circuit 104 writes the external input address to the row selected based on the random data by the activation of an output signal from the comparator 124.

When the address storing/comparing circuit 104 stores the address identical to the external input address in the write operation, the address storing/comparing circuit 104 selects one of the k rows in the cache memory 108 in correspondence with the row containing the address identical to the external input address in the address storing/comparing circuit 104 without activating the control signal for prohibiting the operation of the address decoder 110.

The address storing/comparing circuit 104 has k valid bits provided in correspondence with the k rows. Each of the valid bits shows whether an external input address has been written to the corresponding row or not after power supply to the non-volatile semiconductor memory 100. The respective valid bits are reset to "0" when power is supplied to the non-volatile semiconductor memory 100. The address stored in the row where the valid bit is reset to "0" is excluded from the address comparison target in the read and write operations. When the external input address is written to the row where the valid bit is reset to "0", the valid bit in this row is set to "1" and thereafter the address stored in the corresponding row is used as the address comparison target in the read and write operations. The addresses stored in the respective rows in the address storing/comparing circuit 104 are indefinite immediately after power supply to the non-volatile semiconductor memory 100, but initialization is not required even at the time of power supply to the non-volatile semiconductor memory 100.

When the address storing/comparing circuit 104 stores no address identical to the external input address in the read operation, the random number generator 106 generates random data indicating one of the k rows in the address storing/comparing circuit 104 and outputs the random data to the address storing/comparing circuit 104.

The cache memory 108 is constituted by a volatile memory such as SRAM, and has k rows in correspondence with the k rows in the address storing/comparing circuit 104. Each of the rows in the cache memory 108 contains m memory cells (m: natural number) belonging to a data storing area 108a (area storing actual data of m bits), and n memory cells (n: natural number) belonging to a history storing area 108b (area storing access number data of n bits). At the time of power supply to the non-volatile semiconductor memory 100, "0" data is written to the memory cell belonging to the history storing area 108b of the cache memory 108.

When the address storing/comparing circuit 104 stores the address identical to the external input address in the read operation, data is read from the corresponding part of the data storing area 108a in the row of the cache memory 108 selected by the address storing/comparing circuit 104 (row corresponding to the row which contains the address in correspondence with the external input address in the address storing/comparing circuit 104). When the address storing/comparing circuit 104 stores no address identical to the external input address in the read operation, data is read from the corresponding part of the history storing area 108b in the row of the cache memory 108 selected by the address storing/comparing circuit 104 (row corresponding to the row selected based on the random data in the address storing/comparing circuit 104).

When the address storing/comparing circuit 104 stores the address identical to the external input address in the write operation, the external input data (data supplied from the data input/output buffer 128) is written to the corresponding part of the data storing area 108a of the cache memory 108 in the row selected by the address storing/comparing circuit 104 (row corresponding to the row which contains the address in correspondence with the external input address in the address storing/comparing circuit 104), and the data supplied from the adder 122 is written to the corresponding part of the history storing area 108b of the cache memory 108 in the row selected by the address storing/comparing circuit 104.

When the control signal supplied from the address storing/comparing circuit 104 is deactivated in the read and write operations, the address decoder 110 selects one of the plural rows in the memory cell array 112 in accordance with the external input address (address supplied from the address input buffer 102).

The memory cell array 112 has an internal structure similar to that of the memory cell array 506 shown in FIG. 1, and has a plurality of memory cells MC (FIG. 2) disposed in matrix at the cross points of the plural word lines WL and plate lines PL and m+n pairs of the bit lines BL and BLX. Each of the rows in the memory cell array 112 contains the m memory cells MC belonging to a data storing area 112a (area storing actual data of m bits) and the n memory cells MC belonging to a history storing area 112b (area storing access number data of n bits).

The number of memory cells MC (m) which belong to the data storing area 112a in each of the rows in the memory cell array 112 is 32, for example. The rewritable number of the ferroelectric capacitance is about 1E10. 1E10 is larger than the 33rd power of 2 (approx. 8.6E9) and smaller than the 34th power of 2 (approx. 1.7E10). Thus, the number of memory cells MC (n) belonging to the history storing area 112b in each of the rows in the memory cell array 112 is 34, for example.

When the address storing/comparing circuit 104 contains no address identical to the external input address in the read operation, the sense amplifier 114 reads data from the corresponding part of the data storing area 112a in the selected row in the memory cell array 112 (row selected by the address decoder 110).

When the address storing/comparing circuit 104 stores no address identical to the external input address in the read operation, the write amplifier 116 writes the data read by the sense amplifier 114 again to the corresponding part of the data storing area 112a in the selected row of the memory cell array 112. The write amplifier 116 writes the external input data (data supplied from the data input/output buffer 128) to the corresponding part of the data storing area 112a in the selected row of the memory cell array 112 regardless of whether the address storing/comparing circuit 104 stores the address identical to the external input address or not in the write operation.

When the address storing/comparing circuit 104 stores no address identical to the external input address in the read operation, the sense amplifier 118 reads data from the corresponding part of the history storing area 112b in the selected row of the memory cell array 112. The sense amplifier 118 reads data from the corresponding part of the history storing area 112b in the selected row of the memory cell array 112 regardless of whether the address storing/comparing circuit 104 stores the address identical to the external input address or not in the write operation.

When the address storing/comparing circuit 104 stores no address identical to the external input address in the read operation, the write amplifier 120 writes the data supplied from the adder 122 to the corresponding part of the history storing area 112b in the selected row of the memory cell array 112. The write amplifier 120 writes the data supplied from the adder 122 to the corresponding part of the history storing area 112b in the selected row of the memory cell array 112 regardless of whether the address storing/comparing circuit 104 stores the address identical to the external input address or not in the write operation.

The write amplifier 120 or other components of the non-volatile semiconductor memory 100 are operated in the test mode during the test of the non-volatile semiconductor memory 100 at the time of shipment. By this operation, "1" data is written to the lowest bit in the corresponding part of the history storing area 112b (n memory cells MC) in each row of the memory cell array 112, and "0" data is written to the other bits.

When the address storing/comparing circuit 104 stores no address identical to the external input address in the read operation, the adder 122 generates data indicating the sum of a predetermined value (such as 1) and the value of the data read by the sense amplifier 118, and outputs the generated data to the cache memory 108 and the write amplifier 120. The adder 122 generates data indicating the sum of the predetermined value and the value of the data read by the sense amplifier 118, and outputs the generated data to the cache memory 108 and the write amplifier 120 regardless of whether the address storing/comparing circuit 104 stores the address identical to the external input address or not in the write operation.

When the address storing/comparing circuit 104 stores no address identical to the external input address in the read operation, the comparator 124 compares which of the value indicated by the data read from the history storing area 112b of the memory cell array 112 and the value indicated by the data read from the history storing area 108b of the cache memory 108 is larger. When the former value is larger than the latter value, the comparator 124 activates the output signal.

When the address storing/comparing circuit 104 contains the address identical to the external input address in the read operation, the selector 126 selects the data read from the data storing area 108a of the cache memory 108 and outputs the data to the data input/output buffer 128. When the address storing/comparing circuit 104 stores no address identical to the external input address in the read operation, the selector 126 selects the data read from the data storing area 112a of the memory cell array 112 and outputs the data to the data input/output buffer 128.

In the read operation, the data input/output buffer 128 receives data supplied from the selector 126 and outputs the data to the data input/output pins DQ0 through DQm-1 as external output data. In the write operation, the data input/output buffer 128 receives external input data inputted to the data input/output pins DQ0 through DQm-1 and outputs the data to the cache memory 108 and the write amplifier 116.

The read and write operations of the non-volatile semiconductor memory 100 in the first embodiment are separately described hereinafter.

(Read Operation)

When an external input address is inputted to the address input pins AD0 through ADi-1, the external input address is supplied to the address storing/comparing circuit 104 and the address decoder 110 via the address input buffer 102. Then, the external input address is compared with each of the k addresses stored in the address storing/comparing circuit 104. When the address storing/comparing circuit 104 stores an address identical to the external input address (at the time of cache hit), a row corresponding to the row which contains the address in correspondence with the external input address in the address storing/comparing circuit 104 is selected from the k rows in the cache memory 108. Thereafter, data is read from the corresponding part of the data storing area 108a in the selected row of the cache memory 108, and the data thus read out is outputted to the data input/output pins DQ0 through DQm-1 as external output data via the selector 126 and the data input/output buffer 128.

When the address storing/comparing circuit 104 stores no address identical to the external input address (at the time of cache misshit), a row corresponding to the external input address is selected from the plural rows in the memory cell array 112. Then, data is read from the corresponding part of the data storing area 112a in the selected row of the memory cell array 112 by the sense amplifier 114, and the data thus read out is outputted to the data input/output pins DQ0 through DQm-1 as external output data via the selector 126 and the data input/output buffer 128. The data read by the sense amplifier 114 is written back to the corresponding part of the data storing area 112a in the selected row of the memory cell array 112 by the write amplifier 116.

Simultaneously with these processes, data is read from the corresponding part of the history storing area 112b in the selected row of the memory cell array 112 by the sense amplifier 118. Then, data indicating the sum of a predetermined value and a value indicated by the data read by the sense amplifier 118 is generated by the adder 122, and the data generated by the adder 122 is written to the corresponding part of the history storing area 112b in the selected row of the memory cell array 112 by the write amplifier 120.

In synchronization with these processes, a row is selected from the k rows in the address storing/comparing circuit 104 based on the random data generated by the random number generator 106. Then, a row corresponding to the selected row of the address storing/comparing circuit 104 is selected from the k rows in the cache memory 108, and data is read from the corresponding part of the history storing area 108b in the selected row of the cache memory 108. Subsequently, a value indicated by the data read from the history storing area 112b of the memory cell array 112 and a value indicated by the data read from the history storing area 108b of the cache memory 108 are compared by the comparator 124.

When the value indicated by the data read from the history storing area 112b of the memory cell array 112 is larger, the external input address is written to the selected row of the address storing/comparing circuit 104. Also, the data read from the data storing area 112a of the memory cell array 112 is written to the corresponding part of the data storing area 108a in the selected row of the cache memory 108, and the data generated by the adder 122 is written to the corresponding part of the history storing area 108b in the selected row of the cache memory 108.

When the value indicated by the data read from the history storing area 112b of the memory cell array 112 is equivalent to the value indicated by the data read from the history storing area 108b of the cache memory 108 or when the value indicated by the data read from the history storing area 112b of the memory cell array 112 is smaller, the processes for writing the external input address to the address storing/comparing circuit 104 and for writing the data to the cache memory 108 (data storing area 108a and history storing area 108b) are not performed.

(Write Operation)

When an external input address is inputted to the address input pins AD0 through ADi-1, the external input address is supplied to the address storing/comparing circuit 104 and the address decoder 110 via the address input buffer 102. Then, the external input address is compared with each of the k addresses stored in the address storing/comparing circuit 104. When the address storing/comparing circuit 104 stores an address identical to the external input address (at the time of cache hit), a row corresponding to the external input address is selected from the plural rows in the memory cell array 112. Thereafter, the external input data inputted to the data input/output pins DQ0 through DQm-1 and supplied via the data input/output buffer 128 is written to the corresponding part of the data storing area 112a in the selected row of the memory cell array 112 by the write amplifier 116.

Simultaneously with these processes, data is read from the corresponding part of the history storing area 112b in the selected row of the memory cell array 112 by the sense amplifier 118. Then, data indicating the sum of a predetermined value and a value indicated by the data read by the sense amplifier 118 is generated by the adder 122, and the data generated by the adder 122 is written to the corresponding part of the history storing area 112b in the selected row of the memory cell array 112 by the write amplifier 120.

In synchronization with these processes, a row corresponding to the row containing an address in correspondence with the external input address in the address storing/comparing circuit 104 is selected from the k rows in the cache memory 108. Then, the external input data supplied via the data input/output buffer 128 is written to the corresponding part of the data storing area 108a in the selected row of the cache memory 108, and the data generated by the adder 122 is written to the corresponding part of the history storing area 108b in the selected row of the cache memory 108.

When the address storing/comparing circuit 104 stores no address identical to the external input address (at the time of cache misshit), the process for writing the data to the cache memory 108 (data storing area 108a and history storing area 108b) is not performed. However, the process for writing the data to the memory cell array 112 (data storing area 112a and history storing area 1112b) is performed similarly to the case where the address storing/comparing circuit 104 stores the address identical to the external input address (at the time of cache hit).

According to the first embodiment described above, when cache misshit occurs and the value indicated by the access number data read from the memory cell array 112 is larger than the value indicated by the access number data read from the cache memory 108 in the read operation, the actual data read from the memory cell array 112 and the access number data generated by the adder 122 are written to the cache memory 108. Thus, the actual data is read from the cache memory 108 instead of the memory cell array 112 in the next read operation where the same external input address is used, and therefore the data is not written back to the memory cell array 112. When the address storing/comparing circuit 104 stores no address identical to the external input address in the read operation, the row as the data write target of the cache memory 108 is randomly selected. Therefore, the actual data with addresses having large access numbers are read from the cache memory 108 after access operation (read operation and write operation) is repeated, and thus the addresses having been accessed frequently are read from the cache memory 108 instead of the memory cell array 112. As a result, the number of times of writing data again to the memory cell array 112 in the read operation is considerably reduced, and therefore the life of the non-volatile semiconductor memory 100 can be prolonged.

Figure 4:
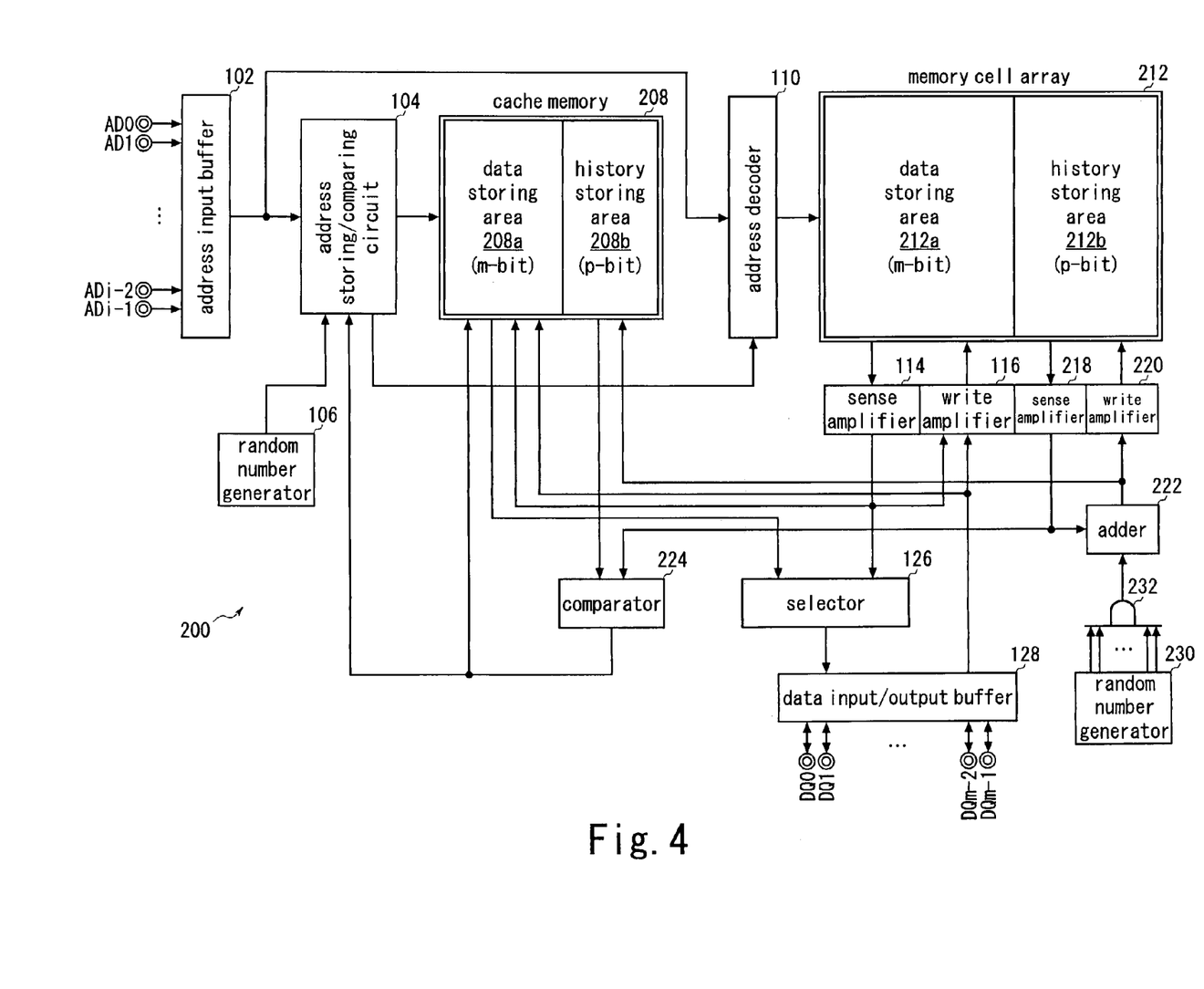
FIG. 4 is a block diagram of a non-volatile semiconductor memory in a second embodiment according to the invention.

FIG. 4 illustrates a non-volatile semiconductor memory in a second embodiment according to the invention. In FIG. 4 (second embodiment), similar reference numerals are given to parts and components similar to those in FIG. 3 (first embodiment), and detailed explanation is not repeated.

According to the structure of a non-volatile semiconductor memory 200 in the second embodiment, a random number generator 230 and an AND gate 232 are added to the components of the non-volatile semiconductor memory 100 in the first embodiment, and the cache memory 108, the memory cell array 112, the sense amplifier 118, the write amplifier 120, the adder 122, and the comparator 124 are replaced with a cache memory 208, a memory cell array 212, a sense amplifier 218, a write amplifier 220, an adder 222, and a comparator 224, respectively.

The cache memory 208 has the same structure as that of the cache memory 108 in the first embodiment except that m memory cells belonging to a data storing area 208a (area storing actual data of m bits) and p memory cells (p: natural number, p<n) belonging to a history storing area 208b (area storing access number data of p bits) are provided in each row of the cache memory 208.

The memory cell array 212 has the same structure as that of the memory cell array 112 in the first embodiment except that the m memory cells MC (FIG. 2) belonging to a data storing area 212a (area storing actual data of m bits) and the p memory cells MC belonging to a history storing area 212b (area storing access number data of p bits) are provided in each row of the memory cell array 212.

The sense amplifier 218, the write amplifier 220, and the comparator 224 have the same structures as those of the sense amplifier 118, the write amplifier 120, and the comparator 124 in the first embodiment, respectively, except that those components in the second embodiment process data having p bits.

The write amplifier 220 or other components of the non-volatile semiconductor memory 200 are operated in the test mode during the test of the non-volatile semiconductor memory 200 at the time of shipment. By this operation, "1" data is written to the lowest bit in the corresponding part of the history storing area 212b (p memory cells MC) in each row of the memory cell array 212, and "0" data is written to the other bits.

When the address storing/comparing circuit 104 stores no address identical to the external input address and the output signal of the AND gate 232 is activated in the read operation, the adder 222 generates data indicating the sum of a predetermined value (such as 1) and a value indicated by the data read by the sense amplifier 218 and outputs the generated data to the cache memory 208 and the write amplifier 220. When the address storing/comparing circuit 104 stores no address identical to the external input address and the output signal of the AND gate 232 is deactivated in the read operation, the adder 222 generates data indicating the same value as the value indicated by the data read by the sense amplifier 218 and outputs the generated data to the cache memory 208 and the write amplifier 220.

When the output signal of the AND gate 232 is activated, the adder 222 generates data indicating the sum of the predetermined value and the value indicated by the data read by the sense amplifier 218 and outputs the generated data to the cache memory 208 and the write amplifier 220 regardless of whether the address storing/comparing circuit 104 stores the address identical to the external input address or not in the write operation. When the output signal of the AND gate 232 is deactivated, the adder 222 generates data indicating the same value as the value indicated by the data read by the sense amplifier 218 and outputs the generated data to the cache memory 208 and the write amplifier 220 regardless of whether the address storing/comparing circuit 104 stores the address identical to the external input address or not in the write operation.

When the address storing/comparing circuit 104 stores no address identical to the external input address in the read operation, the random number generator 230 generates random data having q bits (q: natural number, q=n−p) and outputs the random data to the AND gate 232. The random number generator 230 generates random data having q bits and outputs the random data to the AND gate 232 regardless of whether the address storing/comparing circuit 104 stores the address identical to the external input address or not in the write operation.

The AND gate 232 activates the output signal to "1" when all the bits of the random data supplied from the random number generator 230 indicate "1", and deactivates the output signal to "0" when at least any of the bits of the random data supplied from the random number generator 230 indicates "0".

The read and the write operations of the non-volatile semiconductor memory 200 in the second embodiment are separately described hereinafter.

(Read Operation)

When an external input address is inputted to the address input pins AD0 through ADi-1, the external input address is supplied to the address storing/comparing circuit 104 and the address decoder 110 via the address input buffer 102. Then, the external input address is compared with each of the k addresses stored in the address storing/comparing circuit 104. When the address storing/comparing circuit 104 stores an address identical to the external input address (at the time of cache hit), a row corresponding to the row which contains the address in correspondence with the external input address in the address storing/comparing circuit 104 is selected from the k rows in the cache memory 208. Thereafter, data is read from the corresponding part of the data storing area 208a in the selected row of the cache memory 208, and the data thus read out is outputted to the data input/output pins DQ0 through DQm-1 as external output data via the selector 126 and the data input/output buffer 128.

When the address storing/comparing circuit 104 stores no address identical to the external input address (at the time of cache misshit), a row corresponding to the external input address is selected from the plural rows in the memory cell array 212. Then, data is read from the corresponding part of the data storing area 212a in the selected row of the memory cell array 212 by the sense amplifier 114, and the data thus read out is outputted to the data input/output pins DQ0 through DQm-1 as external output data via the selector 126 and the data input/output buffer 128. The data read by the sense amplifier 114 is written back to the corresponding part of the data storing area 212a in the selected row of the memory cell array 212 by the write amplifier 116.

Simultaneously with these processes, data is read from the corresponding part of the history storing area 212b in the selected row of the memory cell array 212 by the sense amplifier 218. In this step, random data is generated by the random number generator 230, and the output signal of the AND gate 232 is activated to "1" with a probability of 1/(qth power of 2). When the output signal of the AND gate 232 is activated to "1", data indicating the sum of the predetermined value and the value indicated by the data read by the sense amplifier 218 is generated by the adder 222. Then, the data generated by the adder 222 is written to the corresponding part of the history storing area 212b in the selected row of the memory cell array 212 by the write amplifier 220. When the output signal of the AND gate 232 is deactivated to "0", data indicating the same value as the value indicated by the data read by the sense amplifier 218 is generated by the adder 222. Then, the data generated by the adder 222 is written to the corresponding part of the history storing area 212b in the selected row of the memory cell array 212 by the write amplifier 220.

In synchronization with these processes, a row is selected from the k rows in the address storing/comparing circuit 104 based on the random data generated by the random number generator 106. Then, a row corresponding to the selected row of the address storing/comparing circuit 104 is selected from the k rows in the cache memory 208, and data is read from the corresponding part of the history storing area 208b in the selected row of the cache memory 208. Subsequently, a value indicated by the data read from the history storing area 212b of the memory cell array 212 and a value indicated by the data read from the history storing area 208b of the cache memory 208 are compared by the comparator 224.

When the value indicated by the data read from the history storing area 212b of the memory cell array 212 is larger, the external input address is written to the selected row of the address storing/comparing circuit 104. Also, the data read from the data storing area 212a of the memory cell array 212 is written to the corresponding part of the data storing area 208a in the selected row of the cache memory 208, and the data generated by the adder 222 is written to the corresponding part of the history storing area 208b in the selected row of the cache memory 208.

When the value indicated by the data read from the history storing area 212b of the memory cell array 212 is equivalent to the value indicated by the data read from the history storing area 208b of the cache memory 208 or when the value indicated by the data read from the history storing area 212b of the memory cell array 212 is smaller, the processes for writing the external input address to the address storing/comparing circuit 104 and for writing the data to the cache memory 208 (data storing area 208a and history storing area 208b) are not performed.

(Write Operation)

When an external input address is inputted to the address input pins AD0 through ADi-1, the external input address is supplied to the address storing/comparing circuit 104 and the address decoder 110 via the address input buffer 102. Then, the external input address is compared with each of the k addresses stored in the address storing/comparing circuit 104. When the address storing/comparing circuit 104 stores an address identical to the external input address (at the time of cache hit), a row corresponding to the external input address is selected from the plural rows in the memory cell array 212. Thereafter, the external input data inputted to the data input/output pins DQ0 through DQm-1 and supplied via the data input/output buffer 128 is written to the corresponding part of the data storing area 212a in the selected row of the memory cell array 212 by the write amplifier 116.

Simultaneously with these processes, data is read from the corresponding part of the history storing area 212b in the selected row of the memory cell array 212 by the sense amplifier 218. In this step, random data is generated by the random number generator 230, and the output signal of the AND gate 232 is activated to "1" with a probability of 1/(qth power of 2). When the output signal of the AND gate 232 is activated to "1", data indicating the sum of the predetermined value and the value indicated by the data read by the sense amplifier 218 is generated by the adder 222. Then, the data generated by the adder 222 is written to the corresponding part of the history storing area 212b in the selected row of the memory cell array 212 by the write amplifier 220. When the output signal of the AND gate 232 is deactivated to "0", data indicating the same value as the value indicated by the data read by the sense amplifier 218 is generated by the adder 222. Then, the data generated by the adder 222 is written to the corresponding part of the history storing area 212b in the selected row of the memory cell array 212 by the write amplifier 220.

In synchronization with these processes, a row corresponding to the row containing an address in correspondence with the external input address in the address storing/comparing circuit 104 is selected from the k rows in the cache memory 208. Then, the external input data supplied via the data input/output buffer 128 is written to the corresponding part of the data storing area 208a in the selected row of the cache memory 208, and the data generated by the adder 222 is written to the corresponding part of the history storing area 208b in the selected row of the cache memory 208.

When the address storing/comparing circuit 104 stores no address identical to the external input address (at the time of cache misshit), the process for writing the data to the cache memory 208 (data storing area 208a and history storing area 208b) is not performed. However, the process for writing the data to the memory cell array 212 (data storing area 212a and history storing area 212b) is performed similarly to the case where the address storing/comparing circuit 104 stores the address identical to the external input address (at the time of cache hit).

According to the first embodiment described above, the number (m) of the memory cells MC belonging to the data storing area 112a in each of the rows in the memory cell array 1112 is 32, and the number (n) of the memory cells MC belonging to the history storing area 112b in each of the rows in the memory cell array 112 is 34. Thus, the area efficiency of the memory cell array 112 is not necessarily preferable.

However, according to the second embodiment, the number (p) of the memory cells MC belonging to the history storing area 212b in each of the rows in the memory cell array 212 is 18 when the random data generated by the random number generator 230 is data having 16 bits. Addition of 1 to the value (access number) indicated by the data stored in the history storing area 212b of the memory cell array 212 with a probability of 1/(qth power of 2) by access to the memory cell array 212 in the second embodiment is substantially equivalent to addition of 1 to the value (access number) indicated by the data stored in the history storing area 112b of the memory cell array 112 and addition of the qth power of 2 to 1 thereto every time the memory cell array 112 is accessed in the first embodiment. In the second embodiment, therefore, the number of the memory cells MC belonging to the history storing area 212b in each of the rows of the memory cell array 212 is reduced to 18 but the largest possible access number reaches the 34th power of 2 (approx. 1.7E10) which is substantially equivalent to that number in the first embodiment. Thus, the area efficiency of the memory cell array 212 can be considerably improved. Moreover, since the number of memory cells MC belonging to the history storing area 212b in each of the rows of the memory cell array 212 is reduced, the circuit areas of the cache memory 208 (history storing area 208b), the sense amplifier 218, the write amplifier 220, and the comparator 224 can be decreased. Accordingly, the non-volatile semiconductor memory 200 in the second embodiment can offer the advantage of size reduction as well as the advantages similar to those in the first embodiment.

While the non-volatile semiconductor memory according to the invention is applied to the ferroelectric memory in the first and second embodiments, the invention is not limited to these examples. For example, the invention is applicable to a non-volatile semiconductor memory which causes destructive read other than the ferroelectric memory. While the cache memory using the full associative method is employed in the first and second embodiments, the invention is not limited to these examples. For example, a cache memory which uses the direct map method or the set associative method may be used. The respective methods for a cache memory are described in "Computer Organization & Design", written by D. Patterson and J. Hennessy, Nikkei business Publications Inc., for example.

The invention is not limited to the above embodiments and various modifications may be made without departing from the spirit and scope of the invention. Any improvement may be made in part or all of the components.

What is claimed is:

1. A non-volatile semiconductor memory, comprising:
   a non-volatile main memory including a plurality of rows each composed of a corresponding part of a data storing area for storing actual data and a corresponding part of a history storing area for storing access number data;
   an address storing/comparing circuit including a plurality of rows for storing an address; and
   a volatile sub memory including a plurality of rows in correspondence with the plural rows of said address storing/comparing circuit, the plurality of rows each composed of a corresponding part of a data storing area for storing actual data and a corresponding part of a history storing area for storing access number data, wherein:
   when said address storing/comparing circuit stores an address identical to an external input address in read operation, in a row of said sub memory corresponding to a row storing the address identical to the external input address in said address storing/comparing circuit, data is read as external output data from a corresponding part of a data storing area; and
   when said address storing/comparing circuit stores no address identical to the external input address in read operation,
      in a row of said main memory corresponding to the external input address, after data is read as external output data from a corresponding part of a data storing area, the read data is written back thereto, and after data is read from a corresponding part of a history storing area, data indicating a sum of a predetermined value and a value of the read data is written thereto;
      in a row of said sub memory corresponding to a selected row in said address storing/comparing circuit, after data is read from a corresponding part of a history storing area, when a value of the read data from the history storing area of said main memory is larger than a value of the data read from the history storing area of said sub memory, the data read from the data storing area of said main memory is written to a corresponding part of a data storing area, and the data indicating the sum of the predetermined value and the value of the read data from the history storing area of said main memory is written to the corresponding part of the history storing area; and
      in said address storing/comparing circuit, after any of the plural rows is randomly selected, the external input address is written to the selected row when the value of the data read from the history storing area of said main memory is larger than the value of the data read from the history storing area of said sub memory.

2. The non-volatile semiconductor memory according to claim 1, wherein:
   in write operation, in a row of said main memory corresponding to the external input address, external input data is written to a corresponding part of a data storing area, and after data is read from a corresponding part of a history storing area, the data indicating the sum of the predetermined value and the value of the read data is written thereto; and
   when said address storing/comparing circuit stores an address identical to the external input address in write operation, in a row of said sub memory corresponding to a row storing the address identical to the external input address in said address storing/comparing circuit, the external input data is written to a corresponding part of a data storing area, and the data indicating the sum of the predetermined value and the value of the data read from the history storing area of said main memory is written to a corresponding part of a history storing area.

3. The non-volatile semiconductor memory according to claim 1, further comprising a comparator comparing magnitude of the value of the data read from the history storing area of said main memory and of the value of the data read from the history storing area of said sub memory, and activating an output signal when the value of the data read from the history storing area of said main memory is larger; wherein
   when said address storing/comparing circuit stores no address identical to the external input address in read operation,
      in a row of said sub memory corresponding to the selected row in said address storing/comparing circuit, after data is read from a corresponding part of a history storing area, in response to the activation of the output signal of said comparator, data read from the data storing area of said main memory is written to a corresponding part of a data storing area, and the data indicating the sum of the predetermined value and the value of the data read from the history storing area of said main memory is written to the corresponding part of the history storing area; and
      in said address storing/comparing circuit, after any of the plural rows is randomly selected, the external input address is written to the selected row in response to the activation of the output signal of said comparator.

4. The non-volatile semiconductor memory according to claim 1, further comprising an adder generating the data indicating the sum of the predetermined value and the value of the data read from the history storing area of said main memory, wherein
   when said address storing/comparing circuit stores no address identical to the external input address in read operation,
      in a row of said main memory corresponding to the external input address, the data generated by said adder is written to a corresponding part of a history storing area after data is read therefrom; and
      in a row of said sub memory corresponding to the selected row in said address storing/comparing circuit, the data generated by said adder is written to the corresponding part of the history storing area after the data is read therefrom, when the value of the data read from the history storing area of said main memory is larger than the value of the data read from the history storing area of said sub memory.

5. The non-volatile semiconductor memory according to claim 1, further comprising a selector selecting the data read from the data storing area of said sub memory and outputting it as the external output data when said address storing/comparing circuit stores the address identical to the external input address in read operation, and selecting the data read from the data storing area of said main memory and outputting it as the external output data when said address storing/comparing circuit stores no address identical to the external input address in read operation.

6. The non-volatile semiconductor memory according to claim 1, further comprising a data generator generating random data indicating one of the plural rows in said address storing/comparing circuit, wherein when said address storing/comparing circuit stores no address identical to the external input address in read operation, the row indicated by the random data generated by said data generator from the plural rows is selected therein.

7. The non-volatile semiconductor memory according to claim 1, wherein said main memory is composed of memory cells as ferroelectric capacitances.

8. The non-volatile semiconductor memory according to claim 1, wherein:

when said address storing/comparing circuit stores no address identical to the external input address in read operation, in a row of said main memory corresponding to the external input address, after the data is read from a corresponding part of a history storing area, the data indicating the sum of the predetermined value and the value of the read data is written to the corresponding part of the history storing area with a probability of 1/(qth power of 2), q being a natural number.

9. The non-volatile semiconductor memory according to claim 8, further comprising:

a data generator generating random data of q bits;

a logic circuit activating an output signal when all the bits of the random data generated by said data generator indicate respective predetermined logic levels; and an adder generating data indicating the sum of the predetermined value and the value of the data read from the history storing area of said main memory during the activation of the output signal of said logic circuit, and generating data indicating a value same as the value of the data read from the history storing area of said main memory during non-activation of the output signal of said logic circuit, wherein when said address storing/comparing circuit stores no address identical to the external input address in read operation, in the row of said main memory corresponding to the external input address, the data generated by said adder is written to the corresponding part of the history storing area after the data is read therefrom; and in the row of said sub memory corresponding to the selected row in said address storing/comparing circuit, the data generated by said adder is written to the corresponding part of the history storing area after the data is read therefrom, when the value of the data read from the history storing area of said main memory is larger than the value of the data read from the history storing area of said sub memory.

* * * * *